United States Patent
Lee et al.

(10) Patent No.: US 10,060,999 B2
(45) Date of Patent: Aug. 28, 2018

(54) METHOD AND APPARATUS FOR MEASURING MAGNETIC RESONANCE SIGNALS

(71) Applicant: SAMSUNG ELECTRONICS CO., LTD., Suwon-si (KR)

(72) Inventors: Dae-ho Lee, Seoul (KR); Man-woo Lee, Suwon-si (KR); Sang-heum Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1092 days.

(21) Appl. No.: 14/322,507

(22) Filed: Jul. 2, 2014

(65) Prior Publication Data

US 2015/0008920 A1 Jan. 8, 2015

(30) Foreign Application Priority Data

Jul. 3, 2013 (KR) .................. 10-2013-0077942

(51) Int. Cl.
*G01V 3/00* (2006.01)
*G01R 33/44* (2006.01)
*G01R 33/565* (2006.01)

(52) U.S. Cl.
CPC ......... *G01R 33/443* (2013.01); *G01R 33/565* (2013.01); *G01R 33/56572* (2013.01)

(58) Field of Classification Search
CPC .............................................. G01R 33/56572
USPC ....................................... 324/307, 309, 314
See application file for complete search history.

(56) References Cited

U.S. PATENT DOCUMENTS

| | | | |
|---|---|---|---|
| 5,345,178 A | 9/1994 | Manabe et al. | |
| 6,188,219 B1 | 2/2001 | Reeder et al. | |
| 6,294,913 B1 | 9/2001 | Hinks et al. | |
| 6,483,305 B1 | 11/2002 | Miyamoto | |
| 6,522,139 B1* | 2/2003 | Thompson | G01R 33/5615 324/306 |
| 2003/0109781 A1 | 6/2003 | Zhang | |
| 2012/0274322 A1 | 11/2012 | Lee et al. | |
| 2013/0271137 A1* | 10/2013 | Griswold | G01R 33/5611 324/314 |

(Continued)

FOREIGN PATENT DOCUMENTS

| | | |
|---|---|---|
| CN | 102540125 A | 7/2012 |
| JP | 2010-167143 A | 8/2010 |

(Continued)

OTHER PUBLICATIONS

Communication dated Sep. 29, 2014 issued by the Korean Intellectual Property Office in counterpart Korean Patent Application No. 10-2013-0077942.

(Continued)

*Primary Examiner* — Louis Arana
(74) *Attorney, Agent, or Firm* — Sughrue Mion, PLLC

(57) ABSTRACT

Provided are a method and a magnetic resonance imaging apparatus for measuring an MR signal. The method includes: applying a radio frequency (RF) pulse to an object; acquiring, as a response to the RF pulse, a plurality of echo signals from a plurality of readout gradients formed on a gradient coil; measuring delay times of the plurality of echo signals based on points in time when the respective echo signals are acquired; and determining a gradient delay based on the plurality of delay times.

29 Claims, 9 Drawing Sheets

(56) References Cited

U.S. PATENT DOCUMENTS

2014/0167751 A1* 6/2014 He ............... G01R 33/56572
324/307
2015/0035531 A1* 2/2015 Stemmer ............ G01R 33/4836
324/309

FOREIGN PATENT DOCUMENTS

KR      20010060368 A    7/2001
KR        100444090 B1   8/2004
KR     102012012858 A   11/2012

OTHER PUBLICATIONS

Communication dated Nov. 26, 2014 issued by the European Patent Office in counterpart European Patent Application No. 14175452.3.
Ryan K. Robison et al.; "Fast, Simple Gradient Delay Estimation for Spiral MRI"; Magnetic Resonance in Medicine; vol. 63; No. 6; Jun. 1, 2010; pp. 1683-1690; XP055152071; DOI: 10.1002/mrm.22327 , EP Comm. dated Nov. 26, 2014 in 14175452.3.
Ian C. Atkinson et al.; "Characterization and Correction of System Delays and Eddy Currents for MR Imaging with Ultrashort Echo-Time and Time-Varying Gradients"; Magnetic Resonance in Medicine; vol. 62; No. 2; Aug. 1, 2009; pp. 532-537; XP055152073; DOI: 10.1002/mrm.22016, EP Comm. dated Nov. 26, 2014 in 14175452.3.
Ruipeng Ning et al.; "A Versatile Pulse Programmer for Magnetic Resonance Imaging"; Review of Scientific Instruments; vol. 82; No. 5; May 9, 2011; 8 pages total; XP012146436; DOI: 10.1063/1.3587068, EP Comm. dated Nov. 26, 2014 in 14175452.3.
Communication dated Apr. 28, 2015 by the Korean Intellectual Property Office in related Application No. 10-2013-0077942.

* cited by examiner

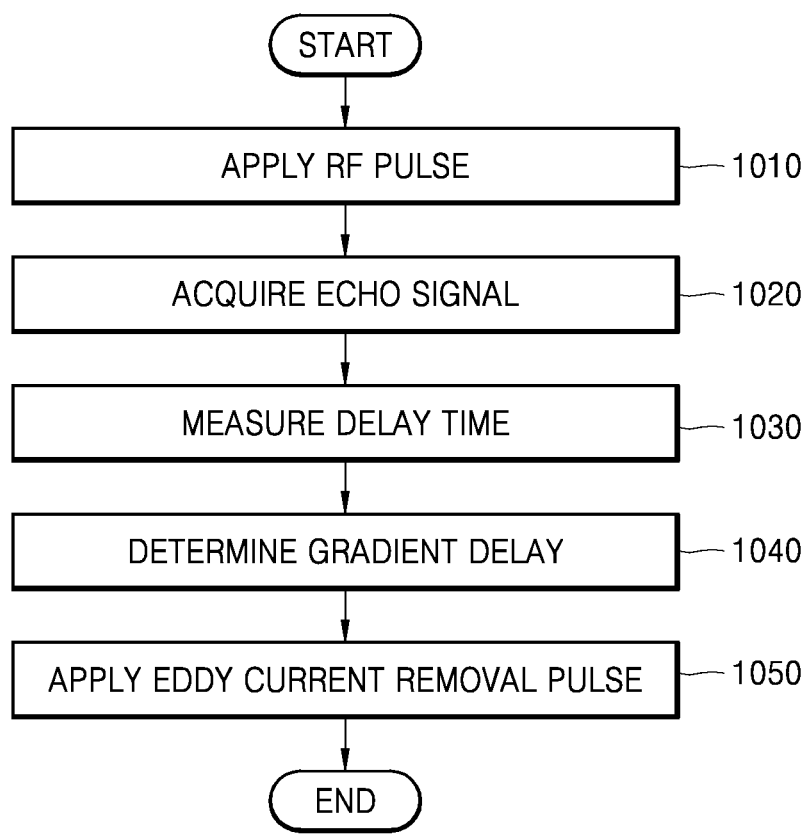

METHOD AND APPARATUS FOR MEASURING MAGNETIC RESONANCE SIGNALS

CROSS-REFERENCE TO RELATED APPLICATION

This application claims priority from Korean Patent Application No. 10-2013-0077942, filed on Jul. 3, 2013, in the Korean Intellectual Property Office, the disclosure of which is incorporated herein in its entirety by reference.

BACKGROUND

1. Field

One or more exemplary embodiments relate to a method and apparatus for measuring magnetic resonance (MR) signals in a magnetic resonance imaging (MRI) system.

2. Description of the Related Art

Magnetic resonance imaging (MRI) creates images by using information determined through the resonance of atomic nuclei exposed to a magnetic field. The resonance of atomic nuclei is a phenomenon where an atomic nucleus in a low energy state absorbs RF energy and is excited to a higher energy state when a specific radio frequency (RF) is incident on the atomic nucleus magnetized by an external magnetic field. Atomic nuclei have different resonant frequencies depending on their types, and the resonance thereof is affected by the intensity of an external magnetic field. The human body includes a large number of atomic nuclei, and hydrogen nuclei are commonly used for MRI.

MRI systems use a noninvasive imaging technique and provide images with superior tissue contrast, compared to computed tomography (CT) systems. In addition, unlike CT images, MRI images are not affected by bone artifacts. Furthermore, the MRI systems can produce various cross-sectional images in desired directions without changing a position of an object, and thus, they are widely used in many medical areas in conjunction with other imaging diagnostic tools.

SUMMARY

One or more exemplary embodiments include a method and apparatus for measuring magnetic resonance (MR) signals in a magnetic resonance imaging (MRI) system.

One or more exemplary embodiments include a non-transitory computer-readable recording medium having recorded thereon a program for executing the above-described method.

Additional aspects will be set forth in part in the description which follows and, in part, will be apparent from the description, or may be learned by practice of the presented embodiments.

According to one or more embodiments, a method of measuring an MR signal includes: applying a radio frequency (RF) pulse to an object; acquiring, as a response to the RF pulse, a plurality of echo signals from a plurality of readout gradients formed on a gradient coil; measuring delay times of the plurality of echo signals based on points in time when the respective echo signals are acquired; and determining a gradient delay based on the plurality of delay times.

The determining of the gradient delay may include calculating the gradient delay by using a product and a sum of the plurality of delay times.

In the calculating of the gradient delay, the gradient delay may be calculated based on a ratio of the product of the plurality of delay times to the sum thereof.

The method may further include forming the plurality of readout gradients having different magnitudes, wherein the delay times of the plurality of echo signals are determined according to the magnitudes of their corresponding readout gradients.

The plurality of readout gradients may include a first readout gradient and a second readout gradient, and the first readout gradient and the second readout gradient may have magnitudes with the same absolute value but different polarities.

The plurality of readout gradients may include a first readout gradient and a second readout gradient, and the first readout gradient and the second readout gradient may have magnitudes with different absolute values but the same polarity.

A product of time and magnitude of each of the readout gradients may be kept constant.

The method may further include measuring a gradient offset based on the plurality of delay times, and in the determining of the gradient delay, the gradient delay may be determined based on the plurality of delay times and the gradient offset.

In the measuring the gradient offset, the gradient offset may be measured by using a sum and a difference of the plurality of delay times.

The method may further include applying a gradient magnetic field obtained by compensating for the gradient delay and receiving an MR signal from the object through the gradient magnetic field.

The RF pulse may include a 180° pulse that refocuses the object after a 90° pulse, and the plurality of echo signals may include a spin echo signal that is a response to the 180° pulse.

The RF pulse may include a plurality of 180° pulses applied sequentially, and the plurality of echo signals may be received from the plurality of readout gradients as a response to the plurality of 180° pulses.

The method may further include measuring a delay time of the RF pulse, and in the determining of the gradient delay, the gradient delay may be determined based on the plurality of delay times and the delay time of the RF pulse.

In the measuring of delay times of the plurality of echo signals, the delay times may be measured by performing frequency conversion on data of the plurality of echo signals.

The method may further include generating an eddy current removal pulse based on the gradient delay and applying the eddy current removal pulse to the gradient coil.

According to one or more embodiments, a non-transitory computer-readable recording medium has recorded thereon a program for executing the above method.

The foregoing general description and the following detailed description are only exemplary and explanatory.

BRIEF DESCRIPTION OF THE DRAWINGS

These and/or other aspects will become apparent and more readily appreciated from the following description of the embodiments, taken in conjunction with the accompanying drawings in which:

FIG. 10 is a flowchart of a method of measuring an MR signal, according to another exemplary embodiment.

DETAILED DESCRIPTION

Figure 1:
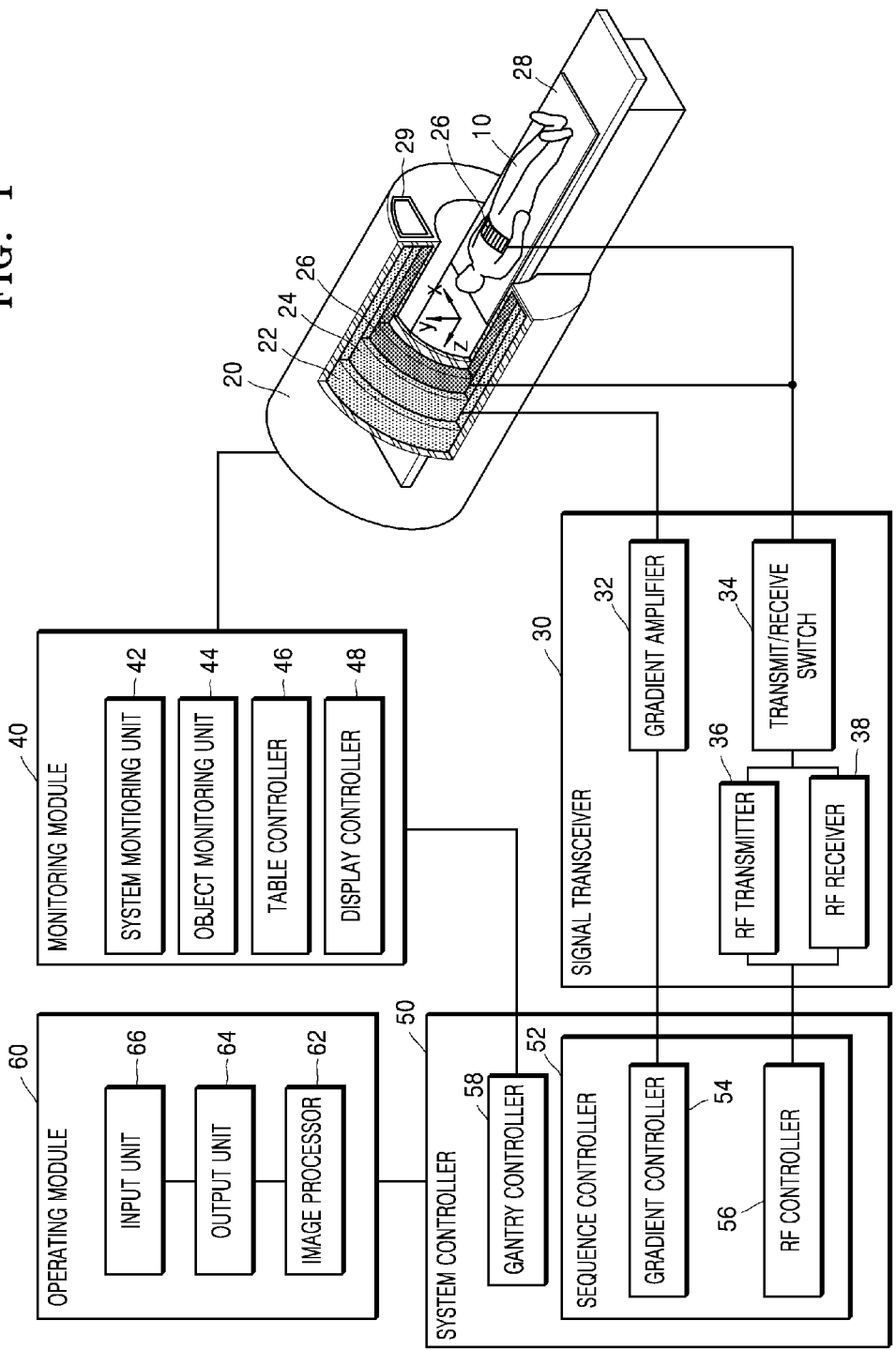
FIG. 1 is a block diagram illustrating the general structure of a magnetic resonance imaging (MRI) system.

Although the terms used herein are generic terms which are currently widely used and are selected by taking into consideration functions thereof in the present application, the meanings of the terms may vary according to the intentions of one of ordinary skill in the art, legal precedents, or the emergence of new technologies. Furthermore, some specific terms may be randomly selected by the applicant, in which case the meanings of the terms may be specifically defined in the description of the present application. Thus, the terms should be defined not by simple appellations thereof but based on the meanings thereof and the context of the description of the present application. As used herein, the term "and/or" includes any and all combinations of one or more of the associated listed items.

It will be understood that when the terms "includes", "comprises", "including", and/or "comprising" when used in this specification, specify the presence of stated elements and/or components, but do not preclude the presence or addition of one or more elements and/or components thereof. The term "module" as used herein means, but is not limited to, a software or hardware component, such as FPGA or ASIC. A module may advantageously be configured to reside on an addressable storage medium and configured to execute on one or more processors. Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality of the components and modules may be combined into fewer components and modules or further separated into additional components and modules.

In this specification, an "image" means multi-dimensional data consisting of discrete image elements such as pixels in a two-dimensional (2D) image or voxels in a three-dimensional (3D) image. For example, the image may include medical images of an object that are acquired by using a Magnetic Resonance Imaging (MRI) system or other medical diagnostic systems.

An "object" or an "examinee" may mean a human body or animal, or any portion of the human body or animal. For example, the object may include internal organs, such as the liver, the heart, the uterus, the brain, a breast, and the abdomen, or blood vessels. The object may also include a phantom. A phantom means a material having a volume closely approximating the density and effective atomic number of living tissue and may include a spherical phantom having similar properties to human tissue.

A "user" means a medical expert, and may be, but is not limited to, a doctor, a nurse, a medical technologist, a medical imaging expert, a radiologist, and a medical equipment repair technician.

A "pulse sequence" is a sequence of signals, which are repeatedly applied to an MRI system. The pulse sequence may include time parameters of a radio frequency (RF) pulse, such as Repetition Time (TR) and Time to Echo (TE).

A "pulse sequence diagram (PSD)" is a diagram for explaining the sequence of events that occur within an MRI system. For example, the PSD may be a diagram showing RF pulses, gradient magnetic fields, and MR signals according to time.

The exemplary embodiments will now be described more fully hereinafter with reference to the accompanying drawings so that they may be easily implemented by one of ordinary skill in the art. The exemplary embodiments may, however, be embodied in many different forms and should not be construed as being limited to the embodiments set forth herein. Parts not related to the present application are omitted to clarify the description of exemplary embodiments. Like numerals denote like elements throughout.

Although some features may be described with respect to individual exemplary embodiments, aspects need not be limited thereto such that features from one or more exemplary embodiments may be combinable with other features from one or more exemplary embodiments.

The aspects of exemplary embodiments are not limited to the disclosed operations and sequence of operations. For instance, operations may be performed by various elements and components, may be consolidated, may be omitted, and may be altered without departing from the spirit and scope of the present application.

An MRI system acquires images of cross-sections of an object by representing as contrast the intensities of MR signals in response to RF signals generated at a magnetic field having a particular strength. For example, when an object is placed in a strong magnetic field and then an RF signal is instantaneously applied to the object, this may cause only a nucleus of a particular atom (e.g., a nucleus of a hydrogen atom) to resonate. When the RF signal is turned off, an MR signal may be emitted from the nucleus of the particular atom. The MRI system may then receive the MR signal to obtain an MR image. The MR signal means an RF signal radiated from the object. A magnitude of the MR signal may be determined by the concentration of a predetermined atom (e.g., hydrogen atom) in the object, T1 and T2 relaxation times, and a flow such as the bloodstream.

An MRI system has different properties than other imaging devices. Unlike imaging devices, such as computed tomography (CT) equipment in which image acquisition depends on an orientation of detecting hardware, the MRI system may acquire a 2D image or 3D volume image oriented toward an arbitrary point. Furthermore, unlike CT, X-ray, positron emission tomography (PET), and single-photon emission computed tomography (SPECT) systems, the MRI system may prevent exposure of an object and an examinee to radioactive rays and acquire images with high soft tissue contrast. Thus, the MRI system allows acquisition of images requiring clear representation of abnormal tissues, such as neurological images, intravascular images, musculoskeletal images, and oncologic images.

FIG. 1 is a schematic diagram of a general MRI system. The general MRI system includes a gantry 20, a signal transceiver 30, a monitoring module 40, a system controller 50, and an operating module 60.

The gantry 20 blocks electromagnetic waves generated by a main magnet 22, a gradient coil 24, and an RF coil 26 from being radiated outside. A static magnetic field and a gradient magnetic field are formed in a bore that is an interior space of the gantry 20, and an RF signal is transmitted toward an object 10.

The main magnet 22, the gradient coil 24, and the RF coil 26 may be arranged along a predetermined direction of the gantry 20. The predetermined direction may include a direction of a coaxial cylinder. The object 10 may be placed on a diagnostic table 28 that can be inserted into the cylinder along a horizontal axis of the cylinder.

The main magnet 22 produces a static magnetic field that causes magnetic dipole moments of atomic nuclei in the object 10 to be aligned in a predetermined direction. As a magnetic field generated by the main magnet 22 becomes stronger and more uniform, it may be possible to acquire more precise and accurate MR images of the object 10.

The gradient coil 24 includes X, Y, and Z coils that respectively produce gradient magnetic fields in X-, Y-, and Z-axes directions that are perpendicular to one another. The gradient coil 24 causes resonant frequencies to change with a part of the object 10 and provides information about the position of the part of the object 10.

The RF coil 26 transmits an RF signal to the object 10, such as a patient, and receives an MR signal emitted from the patient. More specifically, the RF coil 26 may transmit an RF signal having the same frequency as a precession frequency toward atomic nuclei that undergo a precessional motion, stop the transmission of the RF signal, and receive an MR signal emitted from the patient.

For example, to excite an atomic nucleus from a low to a high energy state, the RF coil 26 may produce an electromagnetic wave signal, such as an RF signal, having an RF frequency corresponding to the type of the atomic nucleus, and apply the same to the object 10. Upon application of the electromagnetic wave signal to the atomic nucleus, the atomic nucleus may be excited from a low energy state to a high energy state. Thereafter, when the electromagnetic wave signal disappears, the atomic nucleus undergoes a change in energy level from a high to a low energy state and emits electromagnetic waves having a frequency equal to the Larmor frequency. The RF coil 26 then receives the electromagnetic wave signal emitted from atomic nuclei in the object 10.

The RF coil 26 may be realized as a single RF transceiver coil having both functions of generating electromagnetic waves having RF frequencies corresponding to the type of atomic nuclei and of receiving electromagnetic waves emitted from atomic nuclei. Alternatively, the RF coil 26 may be implemented separately as a transmitter RF coil for generating electromagnetic waves having RF frequencies corresponding to the type of atomic nuclei and a receiver RF coil for receiving electromagnetic waves emitted from atomic nuclei.

The RF coil 26 may be fixedly or removably attached to the gantry 20. When the RF coil 26 is removable, the RF coil 26 may include coils for portions of the object 10 according to the type of a portion of the object 10 to be diagnosed, for example, a head coil, a breast coil, a leg coil, a neck coil, a shoulder coil, a wrist coil, and an ankle coil. The RF coil 26 may also include a birdcage coil, a surface coil, a transverse electromagnetic (TEM) coil depending on the shape and structure of coils.

The RF coil 26 may also be classified into transmit only coils, receive only coils, and transmit or receive coils according to a method of transmitting and/or receiving an RF signal. The RF coil 26 may communicate with an external device in a wired and/or wireless manner, and perform dual tune communication according to a communication frequency spectrum. The RF coil 26 may also include RF coils using various channels, such as 16, 32, 72, and 144 channels.

The gantry 20 may further include a display 29 disposed on the outside thereof and a display (not shown) disposed on the inside thereof so as to provide predetermined information to a user or the object 10.

The signal transceiver 30 controls a gradient magnetic field formed in the interior space, i.e., the bore of the gantry 20, according to a predetermined MR sequence as well as transmission and/or reception of RF signals and MR signals. The signal transceiver 30 may include a gradient amplifier 32, a transmit or receive switch 34, an RF transmitter 36, and an RF receiver 38.

The gradient amplifier 32 drives the gradient coil 24 housed in the gantry 20 and is controlled by a gradient controller 54 to provide a pulse signal used to form a gradient magnetic field. By controlling pulse signals provided by the gradient amplifier 32 to the gradient coil 24, gradient magnetic fields in X-, Y-, and Z-axes directions may be combined together.

The RF transmitter 36 and the RF receiver 38 may drive the RF coil 26. The RF transmitter 36 may provide an RF pulse having a Larmor frequency to the RF coil 26, while the RF receiver 38 may receive an MR signal received by the RF coil 26.

The transmit/receive switch 34 may adjust the direction in which the RF signal and the MR signal are transmitted or received. For example, the transmit or receive switch 34 allows the RF coil 26 to transmit an RF signal to the object 10 in a transmit mode and to receive an MR signal from the object 10 in a receive mode. The transmit or receive switch 34 may be controlled in response to a control signal from an RF controller 56.

The monitoring module 40 may monitor or control the gantry 20 and devices installed on the gantry 20. To achieve this, the monitoring module 40 may include a system monitoring unit 42, an object monitoring unit 44, a table controller 46, and a display controller 48.

The system monitoring unit 42 may monitor and control statuses of a static magnetic field, a gradient magnetic field, an RF signal, the diagnostic table 28, devices for measuring body information about an object, power supply, a heat exchanger, and a compressor.

The object monitoring unit 44 monitors a status of the object 10. To do so, the object monitoring unit 44 may include a camera for observing a movement or position of the object 10, a spirometer for measuring respiration of the object 10, an electrocardiogram (ECG) for measuring the electrical activity of the heart of the object 10, and a thermometer for taking a body temperature of the object 10.

The table controller 46 controls the movement of the diagnostic table 28 on which the object 10 is placed. The table controller 46 may control the movement of the diagnostic table 28 according to a sequence control by a sequence controller 52. For example, for imaging of the moving object 10, the table controller 46 may consistently or intermittently move the diagnostic table 28 according to a sequence control by the sequence controller 52, so that the object 10 may be imaged over an area larger than a field of view (FOV) of the gantry 20.

The display controller 48 may control on and off operations of screens to be displayed on the display 29 disposed on the outside of the gantry 20 and the display disposed on the inside thereof. Furthermore, when a speaker is located on the inside or outside of the gantry 20, the display controller 48 may control on/off operation of the speaker or sound to be output through the speaker.

The system controller 50 includes the sequence controller 52 for controlling a sequence of signals produced in the gantry 20, and a gantry controller 58 for controlling devices installed on the gantry 20.

The sequence controller 52 may include the gradient controller 54 for controlling the gradient amplifier 32, and the RF controller 56 for controlling the RF transmitter 36, the RF receiver 38, and the transmit or receive switch 34. The sequence controller 52 may control the gradient controller 32, the RF transmitter 36, the RF receiver 38, and the transmit or receive switch 34 in response to a pulse sequence received from the operating module 60. In this case, the pulse sequence includes all information needed to control the gradient amplifier 32, the RF transmitter 36, the RF receiver 38, and the transmit or receive switch 34, such as strength, period, and timing of a pulse signal applied to the gradient coil 24.

The operating module 60 may provide pulse sequence information to the system controller 50 while simultaneously controlling the overall operation of the MRI system. The operating module 60 may include an image processor 62 for processing an MR signal received from the RF receiver 38, an output unit 64, and an input unit 66.

The image processor 62 processes the MR signal received from the RF receiver 38 to create an MR image representing MR image data regarding the object 10. The image processor 62 may perform various signal processing techniques on the received MR signal, such as amplification, frequency conversion, phase detection, low frequency amplification, and filtering.

For example, the image processor 62 may arrange digital data in a k-space set in a memory, and perform a Fourier Transform on the digital data to reconstruct image data.

The image processor 62 may also perform synthesis or differential operation on image data if necessary. The synthesis may include addition of image data on a pixel-by-pixel basis and maximum intensity projection (MIP). The image processor 62 may also store reconstructed image data as well as image data subjected to synthesis or differential operation in a memory (not shown) or an external server.

The image processor 62 may perform various signal processing techniques on the MR signal in a parallel manner. For example, the image processor 62 may perform parallel signal processing on a plurality of MR signals received by a multi-channel RF coil to reconstruct the plurality of MR signals into image data.

The output unit 64 may output image data generated or reconstructed by the image processor 62 to the user. The output unit 64 may also output MR images and other information needed for the user to manipulate the MRI system, such as a user interface (UI), user information, or information about the object 10. The output unit 64 may include a speaker, a printer, a Cathode Ray Tube (CRT) display, a Liquid Crystal Display (LCD), a Plasma Display Panel (PDP), an Organic Light-Emitting Diode (OLED) display, a Field Emission Display (FED), an LED display, a Vacuum Fluorescent Display (VFD), a Digital Light Processing (DLP) display, a Plasma-filled Diode (PFD) display, a three-dimensional (3D) display, a transparent display, and other various output devices which are apparent to one of ordinary skill in the art.

The user may use the input unit 66 to enter information about the object 10, parameters, scan conditions, a pulse sequence, image synthesis, or differential operation. The input unit 66 may include a keyboard, a mouse, a trackball, voice recognition, gesture recognition, a touch pad, a touch screen, and other various input devices which are apparent to one of ordinary skill in the art.

Although FIG. 1 shows the signal transceiver 30, the monitoring module 40, the system controller 50, and the operating module 60 as separate components, it will be fully understood by one of ordinary skill in the art that functions performed by each of the signal transceiver 30, the monitoring module 40, the system controller 50, and the operating module 60 may be performed by other components. For example, although the image processor 62 has been described to convert an MR signal received by the RF receiver 38 into a digital signal, the RF receiver 38 or the RF coil 26 may directly convert the MR signal into a digital signal.

The gantry 20, the RF coil 26, the signal transceiver 30, the monitoring unit 40, the system controller 50, and the operating module 60 may be connected to one another in a wired or wireless manner. When the above-described components are connected to one another via a wireless connection, the MRI system may further include a device (not shown) for synchronizing clocks driving the components with one another. The gantry 20, the RF coil 26, the signal transceiver 30, the monitoring module 40, the system controller 50, and the operating module 60 communicate with one another using a high-speed digital interface, such as Low Voltage Differential Signaling (LVDS), asynchronous serial communication, such as Universal Asynchronous Receiver Transmitter (UART), synchronous serial communication, a low latency network protocol, such as Controller Area Network (CAN), optical communication, or other various communication methods that are apparent to one of ordinary skill in the art.

Figure 2:
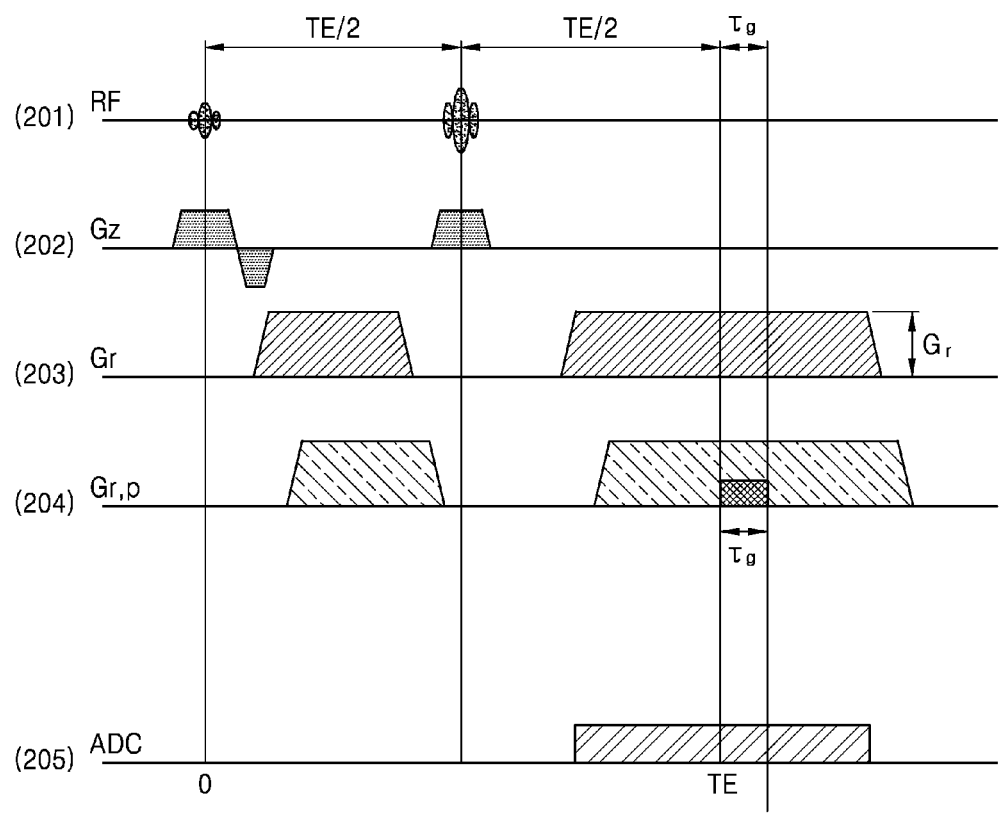
FIG. 2 is a pulse sequence diagram (PSD)

FIG. 2 is a PSD related to an embodiment. The ordinate and abscissa denote the intensity of an RF signal or magnetic field and time, respectively.

One of the characteristics of a gradient magnetic field used in an MRI system is that it may include a gradient delay. The gradient delay refers to a time difference between a gradient magnetic field intended to be applied by an MRI system and an actual gradient magnetic field obtained, and may lead to a degradation of the MRI image quality.

The MRI system may measure a gradient delay by using a change in a position of an echo measured from an MR signal based on intended TE. The MRI system may also use a spin echo (SE) to measure the gradient delay.

In detail, referring to FIG. 2, the MRI system may apply an RF pulse 201 to an RF coil in conjunction with a pulse signal 202 that forms a gradient magnetic field along a Z-axis. Then, the MRI system may measure a time difference between the intended position of an SE signal from an intended readout gradient 203 and a position of a spin echo signal obtained from an actually applied readout gradient 204. In FIG. 2, $\tau_g$ denotes a time difference between the actual and intended SE signals and may be defined as a gradient delay. Reference numeral 205 denotes a signal obtained by converting a spin echo signal via an analog to digital converter (ADC), wherein the spin echo signal is generated by applying an RF pulse.

Another characteristic of a gradient magnetic field may be a gradient offset. The gradient offset is caused by physical characteristics of a gradient amplifier and a gradient coil for creating a gradient magnetic field or an object and may mean a difference between the intensity of a gradient magnetic field intended by an MRI system and the intensity of an actual gradient magnetic field actually obtained as a physical quantity. The gradient offset may also degrade MRI image quality.

The MRI system that operates according to the PSD of FIG. 2 may not consider a gradient offset when measuring a gradient delay. In the absence of a gradient offset, the time difference $\tau_g$ may be determined as a gradient delay. However, in the presence of a gradient offset, the time difference $\tau_g$ has to be compensated for by taking into account an error due to the gradient offset in order to calculate an accurate gradient delay.

A method of accurately measuring a gradient delay in an MRI apparatus and the MRI apparatus according to embodiments will now be described with reference to FIG. 3.

Figure 3:
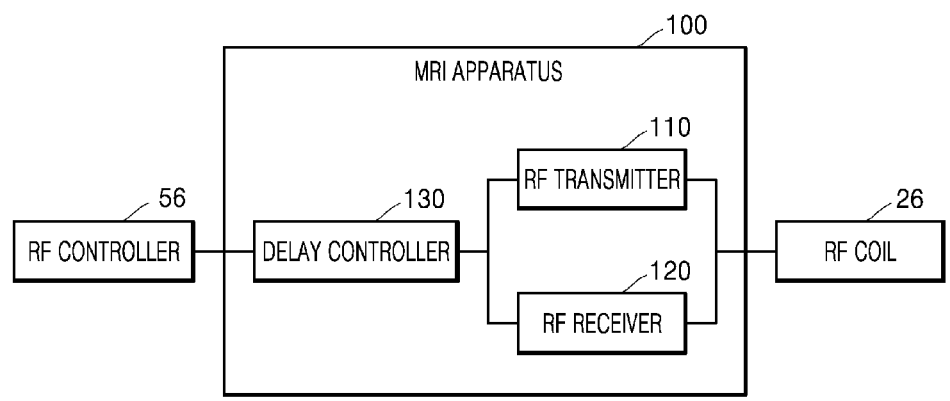
FIG. 3 is a block diagram illustrating a structure of an MRI apparatus according to an exemplary embodiment.

FIG. 3 is a block diagram illustrating a structure of an MRI apparatus 100 according to an exemplary embodiment. Referring to FIG. 3, the MRI apparatus 100 according to the present embodiment includes an RF transmitter 110, an RF receiver 120, and a delay controller 130. The MRI apparatus 100 is not limited to the structure of FIG. 3, and it may further include components other than those illustrated in FIG. 3.

The RF transmitter 110 applies an RF signal or pulse to an RF coil 26. According to the present embodiment, the RF transmitter 110 may apply a 90° RF pulse and a 180° RF pulse that refocuses an object after the 90° RF pulse. The time between application of the 90° RF pulse and reception of an echo signal as a response to the RF pulse may be defined as TE. The RF transmitter 110 may repeatedly apply 180° RF pulses at predetermined time intervals.

The RF receiver 120 acquires an MR signal received by the RF coil 26. In other words, the RF receiver 120 may acquire an echo signal as a response to the applied RF signal or RF pulse. The RF receiver 120 may also receive a gradient echo signal as a response to an RF pulse applied when a gradient magnetic field is applied to a gradient coil.

The RF receiver 120 may also receive a spin echo as a response to a 180° RF pulse that is applied by the RF transmitter 110 to refocus the object. That is, the RF receiver 120 may receive a spin echo produced after the lapse of TE from application of a 90° RF pulse.

The RF receiver 120 may acquire echo signals having different magnitudes and shapes based on RF pulses applied by the RF transmitter 110 and readout gradients formed on the gradient coil. That is, the RF receiver 120 may acquire an echo signal having physical characteristics (e.g. signal shape, frequency components, peak intensity) that may vary depending on the magnitude and shape of a readout gradient. For example, the acquisition time and magnitude of an echo signal may vary depending on the magnitude and polarity of a readout gradient.

The RF receiver 120 may receive an MR signal depending on a gradient delay determined by the delay controller 130 as described below. As described above with reference to FIG. 2, a readout gradient intended by the MRI apparatus 100 may be different from an actual readout gradient formed by the gradient coil in terms of time and magnitude.

Thus, after the delay controller 130 determines a gradient delay, compensation for the gradient delay may be performed thereby compensating for the difference between the intended readout gradient and the actual readout gradient.

Then, the RF receiver 120 may measure an MR signal from a readout gradient obtained after the compensation was performed.

The delay controller 130 measures a delay time of an echo signal, which is a difference between a point in time when the RF receiver 120 actually acquires an echo signal and a point in time when the RF receiver 120 is expected to acquire an echo signal (i.e., after the lapse of TE from application of a 90° RF pulse). The delay time may be denoted by "$\tau$".

In the present embodiment, the delay controller 130 may measure a delay time by using frequency conversion. That is, the delay controller 130 may perform frequency conversion, such as a Fourier Transform, and measure a phase shift in an image subjected to frequency conversion. The delay controller 130 may then perform an inverse transform on the phase shift measured in a frequency domain and measure a delay time in a time domain.

The delay controller 130 may measure a delay time more accurately by using frequency conversion than when measuring a delay time in a time domain without using frequency conversion. For example, when measuring a position of a peak value that is used as a reference point for measuring a delay time of an echo signal, the delay controller 130 may accurately measure even a delay time that is less than a sampling rate.

The delay controller 130 may determine a gradient delay based on the measured delay time. That is, the delay controller 130 may determine the gradient delay by using delay times of a plurality of echo signals.

For example, the delay controller 130 may calculate the gradient delay by using a product and a sum of a plurality of delay times. Furthermore, the delay controller 130 may calculate the gradient delay based on a ratio of the product of the plurality of delay times to the sum thereof. A process of calculating a gradient delay will be described in more detail below with reference to FIGS. 6 and 7A through 7C.

The delay controller 130 may provide information about the determined gradient delay to the RF controller 56, the RF transmitter 110, and the RF receiver 120. Then, the MRI apparatus 100 may receive an MR signal in consideration of a gradient delay, thereby providing an MR image with improved quality.

In another embodiment, the delay controller 130 may also measure a gradient offset. The delay controller 130 may measure delay times of a plurality of echo signals and calculate a gradient offset by using the delay times. For example, the delay controller 130 may measure a gradient offset by using a sum and a difference of a plurality of delay times and use the gradient offset to calculate a gradient delay. A process of measuring a gradient offset will be described in more detail with reference to FIGS. 6 and 7A through 7C.

In yet another embodiment, the delay controller 130 may use a RF delay time to determine a gradient delay. Specifically, the delay controller 130 may measure an RF delay time of an RF pulse that is applied by the RF transmitter 130 and determine a gradient delay in consideration of the RF delay time as well as a plurality of delay times of the echo signals. The process of determining a gradient delay according to an embodiment of the present embodiment will be described in more detail below with reference to FIGS. 6 and 7A through 7C.

The MRI apparatus 100, including the RF transmitter 110, the RF receiver 120, and the delay controller 130, is configured to measure a gradient delay from delay times of a plurality of echo signals, thereby providing high-quality MRI images from which the effects of the gradient delay have been removed.

Figure 4:
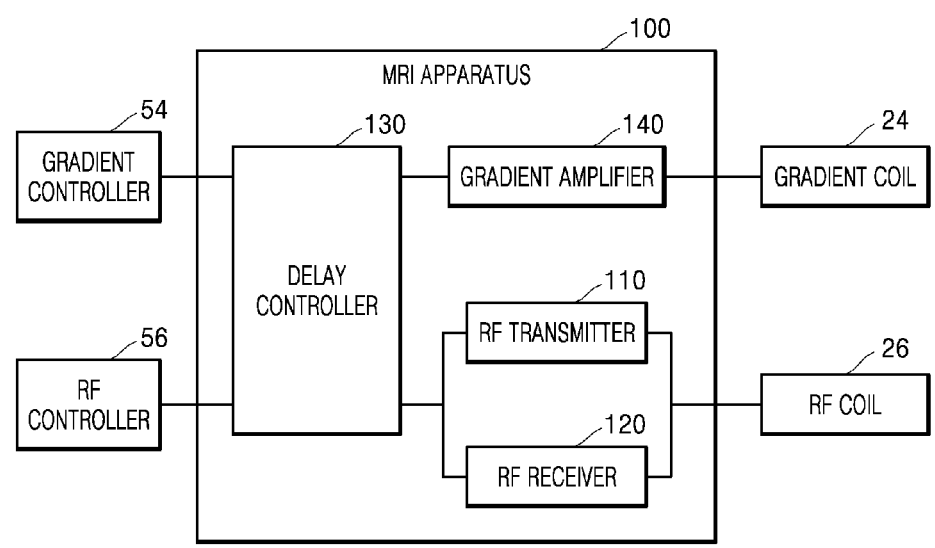
FIG. 4 is a block diagram illustrating a structure of an MRI apparatus according to another exemplary embodiment.

FIG. 4 is a block diagram illustrating a structure of an MRI apparatus 100 according to another exemplary embodiment. In the present embodiment, repeated descriptions with respect to FIG. 3 are omitted to avoid redundancy. Unlike the MRI apparatus 100 of FIG. 3, the MRI apparatus 100 of FIG. 4 further includes a gradient amplifier 140.

The gradient amplifier 140 produces a gradient magnetic field by applying a gradient pulse to a gradient coil 24. The gradient amplifier 140 may also form a readout gradient on the gradient coil 24.

As described above, the RF receiver 120 may receive an echo signal generated in response to a readout gradient generated by the gradient amplifier 140 and an RF pulse applied by the RF transmitter 110. In other words, the RF receiver 120 may receive an echo signal generated by a previously applied readout gradient as a response to an RF signal.

As described above with reference to FIG. 3, various characteristics of the received echo signal may be determined according to a readout gradient generated by the gradient amplifier 140. For example, acquisition times, magnitudes, shapes, and polarities of a plurality of echo signals may be determined based on readout gradients produced by the gradient amplifier 140.

In one embodiment, for the same RF pulse, the gradient amplifier 140 may sequentially form first and second readout gradients having magnitudes with the same absolute value but different polarities on the gradient coil 24. Thus, the RF receiver 120 may acquire two different echo signals at different time points. The two spin echo signals may have different TEs according to the magnitudes of the first and second readout gradients.

For example, in a first measurement, a first RF pulse and a first readout gradient may be applied to the object and the receiver 120 may acquire a first echo signal. Then, in a second measurement, a second RF pulse and a second readout gradient may be applied and the receiver 120 may acquire a second echo signal. The first and second measurements may be performed at different times that are spaced apart by a predetermined period of time which may be adjusted according to measurement needs by, for example, user input, automatic means, or a computer program. The parameters of the first and second measurements may be adjusted according to measurement needs by, for example, user input, automatic means, or a computer program. The parameters of the first and second measurements may include parameters of the RF pulses; parameters of the readout gradients such as gradient magnitude; and the timing of the pulses and gradients. When the parameters of the first measurement and the second measurement are different from each other, the first echo signal recorded in the first measurement may have a different TE and a different shape than the second echo signal recorded in the second experiment. A first delay time corresponding to the first measurement may be determined by using the first echo signal in conjunction with the parameters of the first measurement (e.g. a magnitude of the first readout gradient). A second delay time corresponding to the second measurement may be determined by using the second echo signal in conjunction with the parameters of the second measurement (e.g. a magnitude of the second readout gradient).

In another embodiment, the gradient amplifier 140 may sequentially produce third and fourth readout gradients having the same polarity but different magnitudes. The RF receiver 120 may sequentially acquire two different spin echoes for the same 180° RF pulse according to the third and fourth readout gradients. For example, the RF receiver 120 may acquire two different spin echoes according to two readout gradients, one of which has a magnitude that is N times the magnitude of the other (N is natural number).

In other words, the RF receiver 120 may acquire one spin echo signal that is a response to the third readout gradient and an RF pulse and the other spin echo signal that is a response to the fourth readout gradient and the RF pulse at different times. Then, the delay controller 130 may measure delay times of the two spin echo signals as described previously with reference to FIG. 3.

In yet another embodiment, the gradient amplifier 140 may generate an eddy current removal pulse and applies the same pulse to the gradient coil 24. In detail, the gradient amplifier 140 is configured to generate the eddy current removal pulse that reduces or removes the effects of eddy current and apply the eddy current removal pulse and the readout gradient described above to the gradient coil 24, thereby improving the quality of an MRI image. Alternatively, the gradient amplifier 140 may apply a readout gradient having characteristics of the eddy current removal pulse to the gradient coil 24.

A method of measuring an MR signal, which is performed by the MRI apparatuses 100 illustrated in FIGS. 3 and 4, will now be described with reference to FIG. 5.

Figure 5:
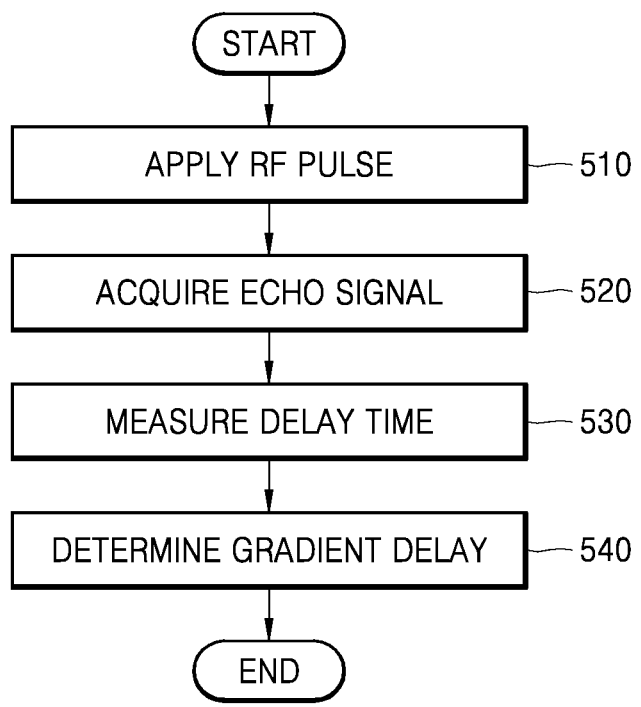
FIG. 5 is a flowchart of a method of measuring an MR signal, according to an exemplary embodiment.

FIG. 5 is a flowchart of a method of measuring an MR signal according to an exemplary embodiment. Referring to FIG. 5, the method includes operations performed in a time series by the MRI apparatus 100, i.e., the RF transmitter 110, the RF receiver 120, the delay controller 130, and the gradient amplifier 140. Thus, although omitted hereinafter, the descriptions with respect to the structures illustrated in FIGS. 3 and 4 may apply to the method illustrated FIG. 5.

Referring to FIGS. 3 through 5, the MRI apparatus 100 applies an RF pulse to the RF coil 26 (operation 510). The RF pulse may be a 180° RF pulse that refocuses an object. The MRI apparatus 100 may form a readout gradient on the gradient coil 24 before operation 510.

The MRI apparatus acquires an echo signal as a response to the RF pulse (operation 520). The echo signal may be a spin echo signal that is a response to the 180° RF pulse applied after a 90° RF pulse. The MRI apparatus 100 may acquire the echo signal that is generated according to the readout gradient formed on the gradient coil 24 before operation 510 and the RF pulse applied in operation 510.

The MRI apparatus 100 may repeatedly perform operations 510 and 520. Specifically, the MRI apparatus 100 may acquire a plurality of spin echo signals as in operation 520 by changing the readout gradient and repeatedly applying the RF pulse as in operation 510. Each of the spin echo signals may have a shape and a magnitude that is determined according to its corresponding readout gradient. For example, each spin echo signal may be acquired at a different delay time from a reference point (e.g., TE) based on the magnitude and shape of the corresponding readout gradient.

The MRI apparatus 100 measures a delay time of the echo signal (operation 530). In detail, the MRI apparatus 100 may measure a delay time of each of the plurality of spin echo signals acquired in operation 520. As described with reference to FIG. 3, a difference between the intended TE and the point in time when the echo signal is actually measured may be defined as the delay time.

The MRI apparatus 100 may perform frequency conversion on echo signal data in order to measure a delay time.

Specifically, as described with reference to FIG. 3, the MRI apparatus 100 may measure a phase shift in a spin echo signal that is in a frequency domain, perform an inverse transform on the phase shift to convert from the frequency domain to the time domain, thereby accurately measuring a delay time.

The MRI apparatus 100 determines a gradient delay (operation 540). The gradient delay may be determined by using delay times of the plurality of spin echo signals. The MRI apparatus 100 may remove the effects of a gradient offset induced by the characteristics of a gradient magnetic field. That is, by removing errors due to the effects of the gradient offset, the MRI apparatus 100 may determine more accurately the time when an MR signal is measured in order to generate a high-quality MRI image.

A method of determining a gradient delay in the MRI apparatus 100, according to an embodiment, will now be described with reference to FIGS. 6 and 7A through 7C.

Figure 6:
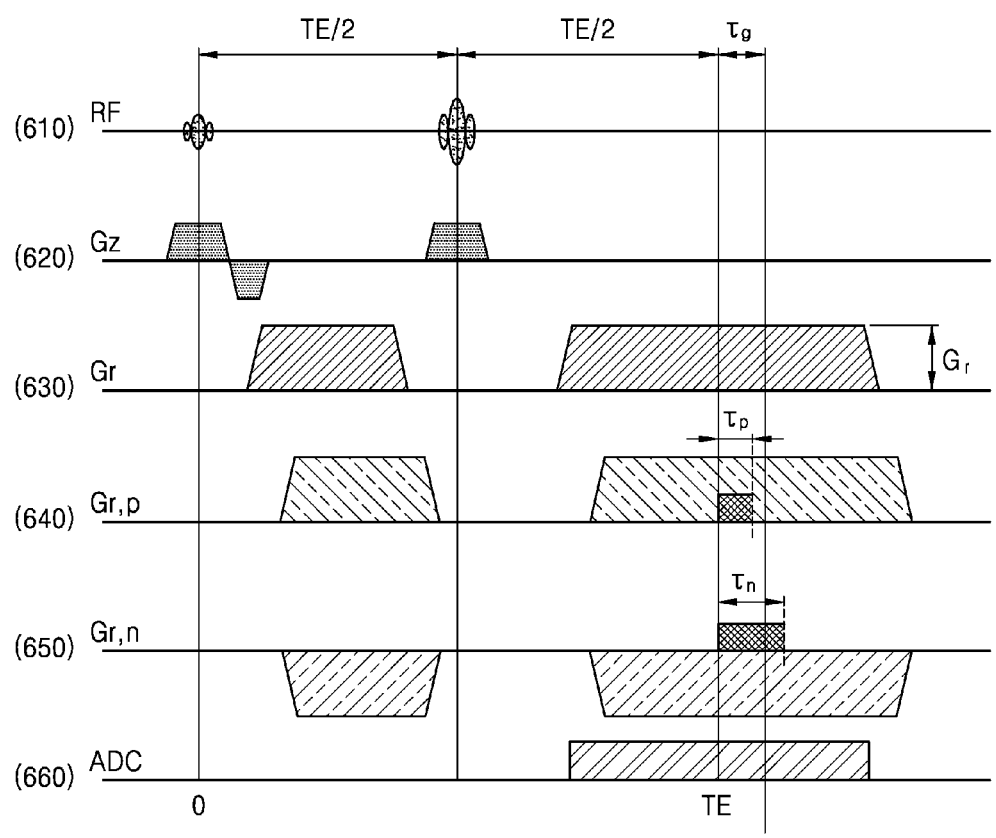
FIG. 6 is a PSD according to an exemplary embodiment.

FIG. 6 is a PSD according to an exemplary embodiment.

The MRI apparatus 100 applies an RF pulse 610 to an RF coil. The MRI apparatus 100 may apply a 180° RF pulse at a point in time that is after a lapse of a period of half the TE ("TE/2") from a reference point (e.g. application of a 90° RF pulse) indicated by "0" at the bottom of the PSD of FIG. 6. The MRI apparatus 100 may also apply a pulse 620 to a Z-gradient coil.

A pulse 630 represents a readout gradient intended for the MRI apparatus 100 to acquire a spin echo signal. The MRI apparatus 100 may expect measurement of a spin echo signal as a response to the 180° RF pulse at the TE.

However, in the presence of a gradient delay $\tau_g$ as described above, the MRI apparatus 100 cannot measure a spin echo accurately at TE. To solve this problem and allow accurate measurement of a gradient delay, the effects of a gradient offset should be removed, and the MRI apparatus 100 may acquire a plurality of spin echo signals, i.e., first and second spin echo signals, having different magnitudes.

As described above with reference to FIG. 3, acquisition times, magnitudes, and shapes of the first and second spin echo signals may be determined according to their corresponding readout gradients that are formed on the gradient coil before application of the RF pulse. Referring to FIG. 6, the MRI apparatus 100 generates first and second readout gradients 640 and 650 having different polarities. Thus, the MRI apparatus 100 may receive the first and second spin echo signals based on the first and second readout gradients 640 and 650 and the RF pulse. Reference numeral 660 denotes a signal obtained by converting a spin echo signal via an analog to digital converter (ADC), wherein the spin echo signal is generated by applying an RF pulse.

The MRI apparatus 100 acquires the first spin echo signal at a point in time that is after a lapse of a period $\tau_p$ from the TE and the second spin echo signal at a point in time that is after a lapse of a period $\tau_n$ from the TE. That is, the MRI apparatus 100 may measure delay times of the first and second echo signals as $\tau_p$ and $\tau_n$, respectively.

The MRI apparatus 100 may then use the delay times of the first and second spin echo signals to accurately measure a point in time at which an MR signal is to be acquired during the imaging of an object. In one embodiment, the MRI apparatus 100 may use a product and a sum of the delay times of the first and second spin echo signals. In detail, the MRI apparatus 100 may determine a point in time at which an MR signal will be received (i.e., a gradient delay) by using a ratio between the product and the sum of the delay times of the first and second spin echo signals.

Figure 7A:
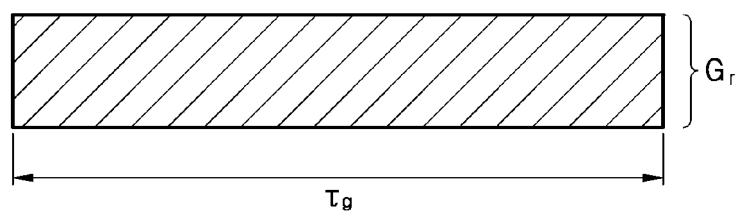
FIGS. 7A, 7B, and 7C illustrate relationships between the delay time and strength of a readout gradient according to an exemplary embodiment.
Figure 7B:
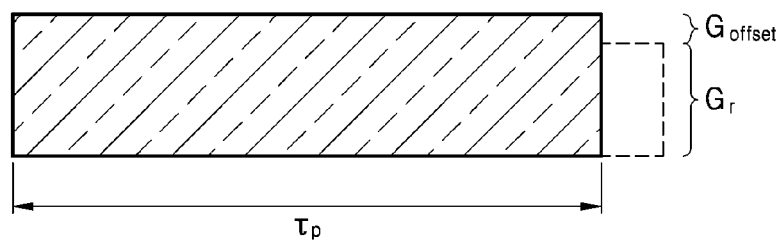
Figure 7C:
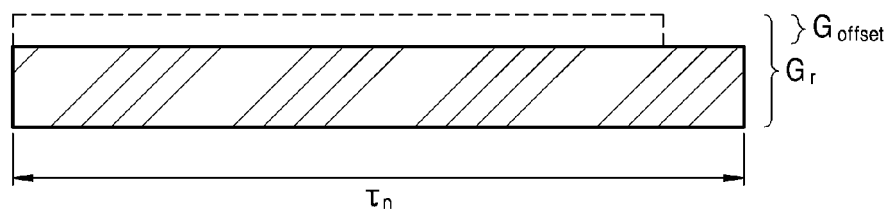

FIGS. 7A through 7C illustrate relationships between delay time and a readout gradient strength according to an exemplary embodiment. Referring to FIG. 7A, a product of a time $\tau_g$ and a strength $G_r$ of a magnetic field applied by the MRI apparatus 100 should be kept constant. That is, an area of a quadrangle shown in FIG. 7A is kept constant regardless of a change in time $\tau_g$ in the abscissa.

Referring to FIG. 7B, a magnetic field $G_r+G_{offset}$ having a strength greater than a strength $G_r$ of a magnetic field indicated by a dashed line in FIG. 7B may be formed for a time $\tau_p$ shorter than a time $\tau_g$. In other words, the MRI apparatus 100 may apply the magnetic field having the strength increased due to a gradient offset $G_{offset}$ during the time $\tau_p$ that is shorter than the time $\tau_g$.

Similarly, referring to FIG. 7C, a magnetic field $G_r-G_{offset}$ having a strength less than a strength $G_r$ of a magnetic field indicated by a dashed line in FIG. 7C may be formed for a time $\tau_n$ longer than a time $\tau_g$. In other words, the MRI apparatus 100 may apply the magnetic field having the strength decreased due to a gradient offset $G_{offset}$ for the time $\tau_n$ that is longer than the time $\tau_g$.

Since a product of a magnetic field strength and the applied time should be kept constant, the relationships described with reference to FIGS. 7A through 7C may be defined by Equation (1) below:

$$\tau_g * G_r = (G_r + G_{offset}) * \tau_p (G_r - G_{offset}) * \tau_n \quad (1)$$

That is, the product of the magnetic field strength and the applied time is kept constant. The following Equation (2) may be derived from Equation (1) above:

$$\tau_g = 2 * \tau_n * \tau_p / (\tau_n + \tau_p) \quad (2)$$

As shown in Equation (2), a gradient delay $\tau_g$ may be defined by using a product and a sum of delay times $\tau_p$ and $\tau_n$ of first and second spin echo signals. Thus, the MRI apparatus 100 may measure the delay times $\tau_p$ and $\tau_n$ of the first and second spin echo signals and calculate a gradient delay by using a ratio of the product of the two delay times $\tau_p$ and $\tau_n$ to the sum thereof.

The MRI apparatus 100 may measure a gradient delay by using delay times of a plurality of spin echo signals to accurately measure the time of an MR signal.

The following Equation (3) may also be derived from Equation (1) above:

$$G_{offset} = G_r * (\tau_n - \tau_p)/(\tau_n + \tau_p) \quad (3)$$

As shown in Equation (3), the MRI apparatus 100 may measure the gradient delay as well as a gradient offset $G_{offset}$ by using the delay times $\tau_p$ and $\tau_n$ of the first and second spin echo signals. The gradient offset $G_{offset}$ may be measured by using a ratio between a difference and a sum of the two delay times $\tau_p$ and $\tau_n$. That is, the MRI apparatus 100 may measure a gradient delay from the gradient offset $G_{offset}$ that is an error caused by the physical characteristics of a gradient magnetic field by using Equations (1) and (3).

Further, an RF delay time of an RF pulse may be taken in account when determining a gradient delay. The RF delay time of the RF pulse may be determined during measurements of the gradient delay $\tau_g$. While Equations (1) and (3) are applied when there is no RF delay time of an RF pulse, the following Equation (4) may be derived from Equation (1) in consideration of an RF delay time $\tau_r$:

$$\tau_g = \{2 * \tau_n * \tau_p - \tau_r * (\tau_n + \tau_p)\}/(\tau_n + \tau_p - 2 * \tau_r) \quad (4)$$

The MRI apparatus 100 may measure a gradient delay by using Equation (4) in consideration of the delay times $\tau_p$ and $\tau_n$ and the RF delay time $\tau_r$. In the presence of the RF delay time $\tau_r$, the following Equation (5) may be derived from Equation (3) above:

$$G_{offset}=G_r*(\tau_n-\tau_p)/(\tau_n+\tau_p-2*\tau_r) \qquad (5)$$

As described above with reference to FIGS. 6 and 7A through 7C, the MRI apparatus 100 determines a gradient delay by using a delay time of a spin echo signal. The MRI apparatus 100 may also form a readout gradient in advance in order to adjust the acquisition time, magnitude, and shape of a spin echo signal. As shown in FIG. 6, the MRI apparatus 100 may form readout gradients having the same absolute value but different polarities.

The MRI apparatus 100 may form readout gradients having the same polarity but different magnitudes a plurality of times. For example, the MRI apparatus 100 may sequentially generate readout gradients, each of which has a magnitude that is N times the magnitude of another one (N is natural number). Thus, the MRI apparatus 100 may acquire two spin echo signals at different points in time. However, the embodiments are not limited to N times, and the MRI apparatus 100 may acquire spin echo signals at different points in time over a plurality of times by forming a plurality of readout gradients having different magnitudes.

Figure 8:
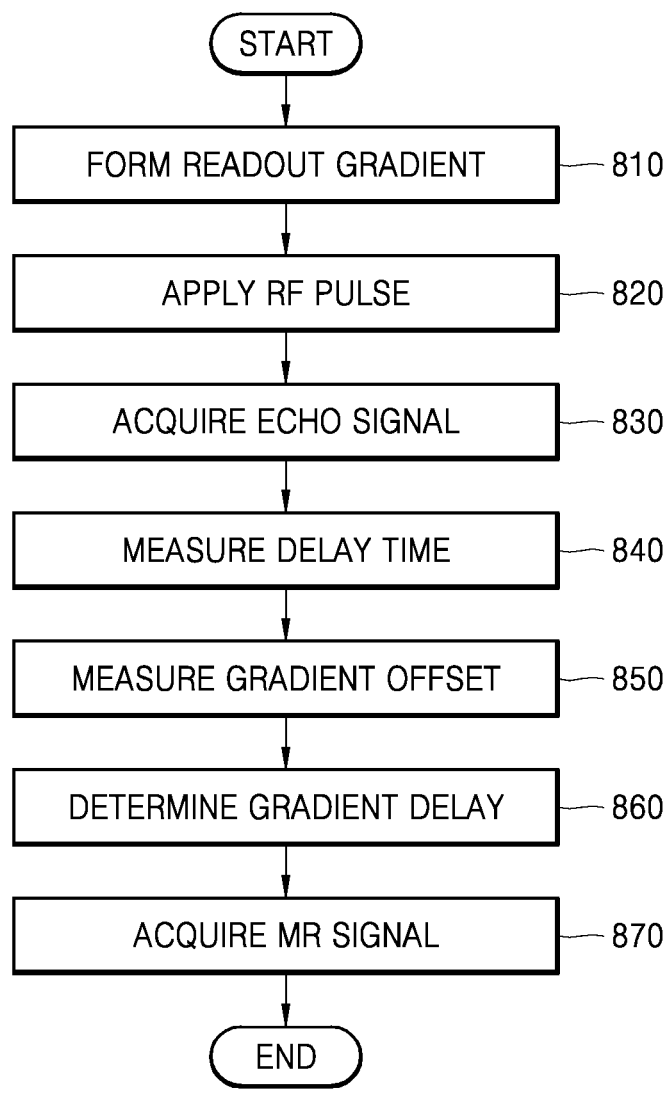
FIG. 8 is a flowchart of a method of measuring an MR signal, according to another exemplary embodiment.

FIG. 8 is a flowchart of a method of measuring an MR signal, according to another exemplary embodiment. Repeated descriptions with respect to FIG. 5 are omitted to avoid redundancy.

Referring to FIG. 8, the MRI apparatus 100 forms a readout gradient on a gradient coil (operation 810). As described above, the MRI apparatus 100 may produce readout gradients having different magnitudes, shapes, and polarities a plurality of times in order to acquire a plurality of spin echo signals at different points in time (operation 830).

The MRI apparatus 100 then applies an RF pulse (operation 820) and acquires an echo signal as a response to the RF pulse (operation 830). In one embodiment, the MRI apparatus 100 may apply an RF pulse that refocuses an object and acquire a spin echo signal as a response thereto. By forming readout gradients a plurality of times in operation 810 and applying an RF pulse a plurality of times in operation 820, the MRI apparatus 100 may repeatedly perform operation 810.

The MRI apparatus 100 measures a delay time of the spin echo signal (operation 840). The delay time may be a difference between the intended TE and a point in time at which a peak value of each of the spin echo signals is detected. The MRI apparatus 100 may accurately measure the delay time by using frequency conversion.

The MRI apparatus 100 measures a gradient offset (operation 850). In detail, the MRI apparatus 100 may measure the gradient offset based on a ratio of a difference between delay times of two spin echo signals to a sum of the delay times thereof.

The MRI apparatus 100 determines a gradient delay (operation 860). In one embodiment, the MRI apparatus 100 may determine the gradient delay by using a product and a sum of delay times of two spin echo signals or a ratio of the product to the sum.

The MRI apparatus 100 may also calculate the gradient delay by using the gradient offset obtained in operation 850. The MRI apparatus 100 may measure a delay time of an RF pulse and may use the measured delay time of the RF pulse to determine the gradient delay.

The MRI apparatus 100 acquires an MR signal in consideration of the gradient delay measured in operation 860 (operation 870). That is, the MRI apparatus 100 and the operation of the MRI apparatus 100 may be adjusted to account for the effects of the gradient delay. Then, the MRI apparatus 100 may form a readout gradient and acquire an MR signal from the object at a point in time at which errors caused by the effects of the gradient offset have been corrected, thereby providing an MR image with improved quality.

Figure 9:
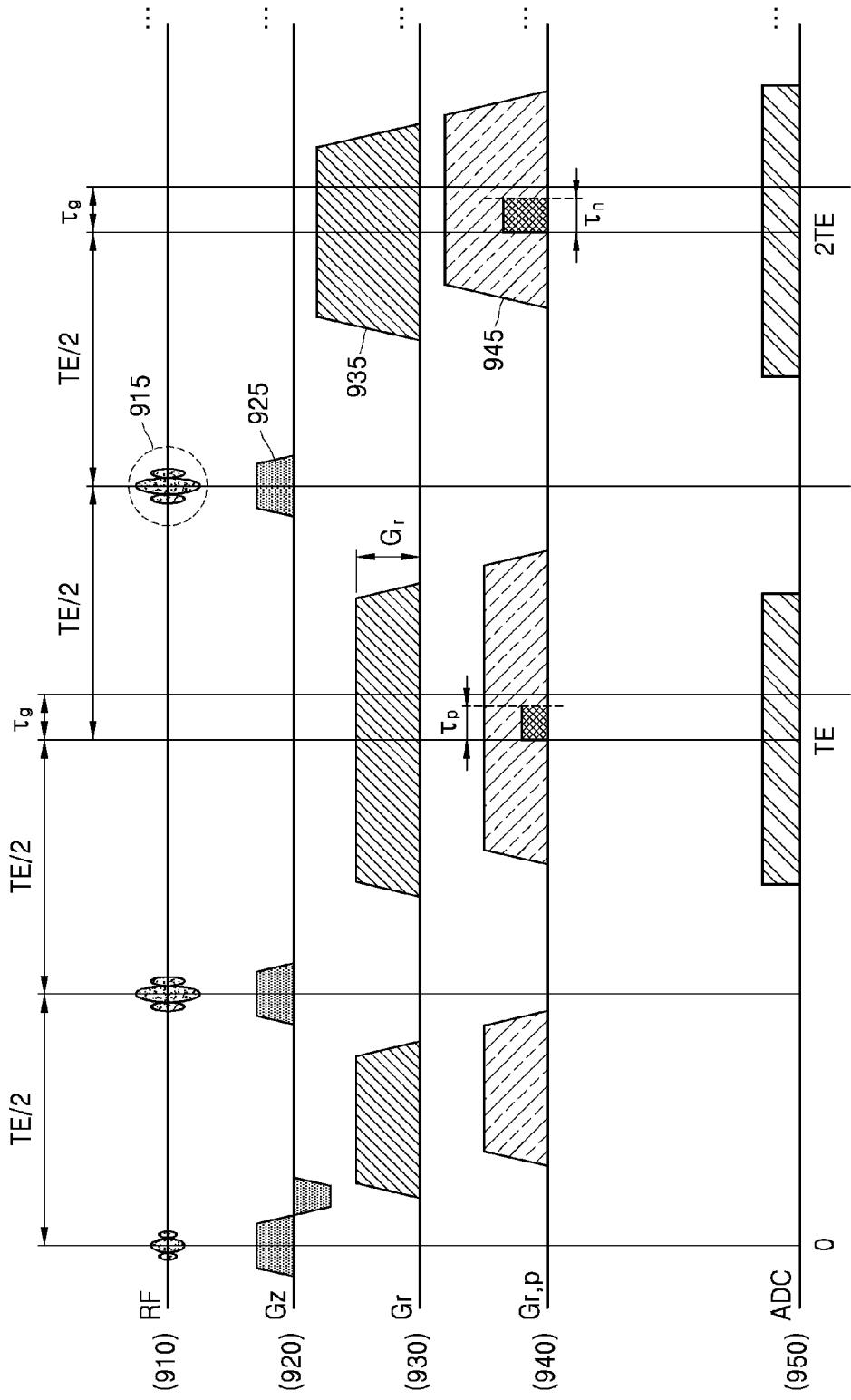
FIG. 9 is a PSD according to another exemplary embodiment.

FIG. 9 is a PSD according to another exemplary embodiment.

FIG. 9 shows an example of sequentially applying 180° RF pulses a plurality of times from the MRI apparatus 100. In detail, the MRI apparatus 100 applies a 180° RF pulse that refocuses the object after a 90° RF pulse. After a predetermined period elapses from TE for the 180° RF pulse, another 180° RF pulse is applied. That is, the MRI apparatus 100 may sequentially apply 180° RF pulses a plurality of times.

The MRI apparatus 100 may receive a plurality of echo signals as a response to the plurality of 180° RF pulses applied sequentially. As shown in FIG. 9, the MRI apparatus 100 may receive an echo signal in response to a second 180° RF pulse 915 after a second TE has passed. In an exemplary embodiment, the first TE and the second TE may be set to be substantially equal to each other. In another exemplary embodiment the first TE and the second TE may be set to be different from each other. As described above with reference to FIG. 6, a pulse 930 represents a readout gradient 935 intended by the MRI apparatus 100, and a pulse 940 represents a readout gradient 945 actually formed by the MRI apparatus 100. Reference numeral 950 denotes a signal obtained by converting a spin echo signal via an analog to digital converter (ADC), wherein the spin echo signal is generated by applying an RF pulse.

The MRI apparatus 100 may measure a gradient delay by using the echo signals received in response to the first and second 180° RF pulses. In detail, the MRI apparatus 100 may measure delay times of echo signals received continuously as a response to RF pulses applied sequentially and use the delay times to calculate gradient delays. The MRI apparatus 100 may calculate a gradient delay by using two delay times $\tau_p$ and $\tau_n$ in the same manner as described above with reference to FIGS. 6 and 7A through 7C.

Specifically, the MRI apparatus 100 may receive echo signals from two or more readout gradients having different magnitudes to determine a gradient delay and apply a readout gradient obtained after compensating for the measured gradient delay to receive an MR signal.

FIG. 10 is a flowchart of a method of measuring an MR signal, according to another exemplary embodiment. Repeated descriptions with respect to FIGS. 5 and 8 are omitted to avoid redundancy.

Referring to FIG. 10, the MRI apparatus 100 applies an eddy current removal pulse to a gradient coil (operation 1050). In detail, the MRI apparatus 100 generates the eddy current removal pulse described above with reference to FIG. 3 according to a gradient delay calculated in operation 1040. Subsequently, the MRI apparatus 100 may apply the eddy current removal pulse and a readout current to the gradient coil. Furthermore, the MRI apparatus 100 may reflect the eddy current removal pulse instead of the readout gradient.

The above methods according to the exemplary embodiments can be recorded in programs that can be executed on a computer and be implemented through general purpose digital computers which can run the programs using a computer-readable recording medium. Data structures described in the above method can also be recorded on a computer-readable medium in a variety of ways. Program storage devices that can be used to describe a storage device containing computer codes executable to perform various methods according to exemplary embodiments are not understood to include transitory media such as carrier waves or signals. Examples of the medium include recording media, such as magnetic storage media (e.g., ROM, floppy disks, hard disks, etc.), and optical recording media (e.g., CD-ROMs or DVDs).

As described above, a method and MRI apparatus for measuring an MR signal according to the one or more of the above exemplary embodiments allow accurate determination of a gradient delay by determining and using delay times of a plurality of spin echo signals. That is, the method and MRI apparatus are adapted to determine a gradient delay with the effects of a gradient offset removed, thereby improving the quality of an MR image.

Furthermore, the gradient offset itself may be measured. An MR signal may also be acquired at a point in time at which the gradient delay has been considered, thereby providing high-quality MRI images.

The above MRI imaging methods may implemented in various circumstances, implementations and embodiments. In an exemplary embodiment, the measurements of the echo signals used to determine the gradient delays may be performed directly on the object (e.g. a body part of a patient) right before performing the MRI imaging of the object. The gradient delays corresponding to the echo signals are determined. The MRI apparatus may then adjust or calibrate the imaging parameters to account for the measured gradient delays. Then, MRI imaging may be performed on the object by taking in account the effects of the gradient delay. The object may be kept in the same position in the MRI apparatus while performing all of the above mentioned steps: measuring of the echo signals, adjusting or calibrating the imagining parameters, and performing the imaging. The time periods between the above steps may be adjusted according to imaging needs. For example the time periods may be minimized. Measurements of the echo signals may be performed at various times during imaging of an object such as to readjust or recalibrate the MRI apparatus and to take into account changes of the gradient delay that may happen during an MRI imaging session of an object. For instance, if the MRI imaging session of an object is long, it may be necessary to recalibrate or readjust the apparatus.

In another exemplary embodiment, the measurements of the echo signals used to determine the gradient delays may be performed on a first object (e.g. a phantom) before performing the MRI imaging of a second object (e.g. a body part of a patient). The MRI apparatus may then adjust or calibrate the imaging parameters, according to the gradient delays measured on the first object (e.g. a phantom), to account for the measured gradient delays. Then, MRI imaging may be performed on the second object (e.g. a patient) by taking in account the effects of the gradient delays measured with respect to the first object (e.g. the phantom).

While one or more exemplary embodiments have been described with reference to the figures, it will be understood by one of ordinary skill in the art that various changes in form and details may be made therein without departing from the spirit and scope of the present inventive concept as defined by the following claims. Thus, it should be understood that the exemplary embodiments described therein should be considered in a descriptive sense only and not for purposes of limitation.

In addition, many modifications can be made to adapt a particular situation or material to the teachings of the present disclosure without departing from the essential scope thereof. Therefore, it is intended that the present disclosure not be limited to the particular exemplary embodiments disclosed as the best mode contemplated for carrying out the present disclosure, but that the present disclosure will include all embodiments falling within the scope of the appended claims.

What is claimed is:

1. A method of measuring a magnetic resonance (MR) signal, the method comprising:
   applying at least one radio frequency (RF) pulse to an object;
   acquiring, as a response to the RF pulse, a plurality of echo signals from a plurality of readout gradients formed on a gradient coil;
   measuring a plurality of delay times, each of the plurality of delay times being associated with a corresponding echo signal of the plurality of echo signals, the plurality of delay times being measured based on points in time when the plurality of echo signals are acquired;
   measuring a gradient offset based on the plurality of delay times; and
   determining a gradient delay based on the plurality of delay times and the gradient offset.

2. The method of claim 1, wherein the determining of the gradient delay comprises calculating the gradient delay by using a product of the plurality of delay times and a sum of the plurality of delay times.

3. The method of claim 2, wherein in the calculating of the gradient delay, the gradient delay is calculated based on a ratio of the product of the plurality of delay times to the sum of the plurality of delay times.

4. The method of claim 1, further comprising forming the plurality of readout gradients such that the plurality of readout gradients have different magnitudes,
   wherein the plurality of delay times of the plurality of echo signals are determined according to magnitudes of the plurality of readout gradients.

5. The method of claim 4, wherein the plurality of readout gradients comprise a first readout gradient and a second readout gradient, and
   wherein the first readout gradient and the second readout gradient have magnitudes with a same absolute value and the first readout gradient and the second readout gradient have different polarities.

6. The method of claim 4, wherein the plurality of readout gradients comprise a first readout gradient and a second readout gradient, and
   wherein the first readout gradient and the second readout gradient have magnitudes with different absolute values and the first readout gradient and the second readout gradient have a same polarity.

7. The method of claim 4, wherein a product of time and magnitude of the plurality of readout gradients is kept constant.

8. The method of claim 1, wherein the measuring the gradient offset comprises measuring the gradient offset by using a sum of the plurality of delay times and a difference of the plurality of delay times.

9. The method of claim 1, further comprising applying a gradient magnetic field obtained by compensating for the gradient delay and receiving an MR signal from the object disposed in the gradient magnetic field.

10. The method of claim 1, wherein the RF pulse comprises a 180° pulse that refocuses the object after a 90° pulse, and wherein the plurality of echo signals comprise a spin echo signal that is a response to the 180° pulse.

11. The method of claim 1, wherein the RF pulse comprises a plurality of 180° pulses applied sequentially, and
wherein the plurality of echo signals corresponding to the plurality of readout gradients are received as responses to the plurality of 180° pulses.

12. The method of claim 1, further comprising measuring a delay time of the RF pulse,
wherein the determining of the gradient delay comprises determining of the gradient delay based on the plurality of delay times and the delay time of the RF pulse.

13. The method of claim 1, wherein the measuring of delay times of the plurality of echo signals comprises measuring the delay times by performing frequency conversion on data of the plurality of echo signals.

14. The method of claim 1, further comprising generating an eddy current removal pulse based on the gradient delay and applying the eddy current removal pulse to the gradient coil.

15. A magnetic resonance imaging (MRI) apparatus for measuring a magnetic resonance (MR) signal, the MRI apparatus comprising:
a radio frequency (RF) transmitter that applies an RF pulse to an object;
an RF receiver that acquires, as a response to the RF pulse, a plurality of echo signals from a plurality of readout gradients formed on a gradient coil; and
a delay controller that measures a plurality of delay times of the plurality of echo signals, the plurality of delay times being measured based on points in time when the respective echo signals are acquired, measures a gradient offset based on the plurality of delay times and determines a gradient delay based on the plurality of delay times and the gradient offset.

16. The MRI apparatus of claim 15, wherein the delay controller calculates the gradient delay by using a product of the plurality of delay times and a sum of the plurality of delay times.

17. The MRI apparatus of claim 16, wherein the delay controller calculates the gradient delay based on a ratio of the product of the plurality of delay times to the sum of the plurality of delay times.

18. The MRI apparatus of claim 15, further comprising a gradient amplifier for forming the plurality of readout gradients such that the plurality of readout gradients have different magnitudes,
wherein the delay times of the plurality of echo signals are determined according to the magnitudes of their corresponding readout gradients.

19. The MRI apparatus of claim 18, wherein the plurality of readout gradients comprise a first readout gradient and a second readout gradient, and
wherein the first readout gradient and the second readout gradient have magnitudes with the same absolute value and the first readout gradient and the second readout gradient have different polarities.

20. The MRI apparatus of claim 18, wherein the plurality of readout gradients comprise a first readout gradient and a second readout gradient, and
wherein the first readout gradient and the second readout gradient have magnitudes with different absolute values and the first readout gradient and the second readout gradient have the same polarity.

21. The MRI apparatus of claim 18, wherein a product of time and magnitude of the readout gradients is kept constant.

22. The MRI apparatus of claim 15, wherein the delay controller measures the gradient offset by using a sum of the plurality of delay times and a difference of the plurality of delay times.

23. The MRI apparatus of claim 15, further comprising a gradient amplifier for applying a gradient magnetic field obtained by compensating for the gradient delay,
wherein the RF receiver receives an MR signal from the object disposed in the gradient magnetic field.

24. The MRI apparatus of claim 15, wherein the RF pulse comprises a 180° pulse that refocuses the object after a 90° pulse, and
wherein the plurality of echo signals comprise a spin echo signal that is a response to the 180° pulse.

25. The MRI apparatus of claim 15, wherein the RF pulse comprises a plurality of 180° pulses applied sequentially, and
wherein the plurality of echo signals corresponding to the plurality of readout gradients are received as responses to the plurality of 180° pulses.

26. The MRI apparatus of claim 15, wherein the delay controller measures a delay time of the RF pulse and determines the gradient delay based on the plurality of delay times and the delay time of the RF pulse.

27. The MRI apparatus of claim 15, wherein the delay controller measures delay times of the plurality of echo signals by performing frequency conversion on data of the plurality of echo signals.

28. The MRI apparatus of claim 15, further comprising a gradient amplifier for generating an eddy current removal pulse based on the gradient delay and applying the eddy current removal pulse to the gradient coil.

29. A non-transitory computer-readable recording medium having recorded thereon a program for executing the method comprising:
applying at least one radio frequency (RF) pulse to an object;
acquiring, as a response to the RF pulse, a plurality of echo signals from a plurality of readout gradients formed on a gradient coil;
measuring a plurality of delay times, each of the plurality of delay times being associated with a corresponding echo signal of the plurality of echo signals, the plurality of delay times being measured based on points in time when the plurality of echo signals are acquired;
measuring a gradient offset based on the plurality of delay times; and
determining a gradient delay based on the plurality of delay times and the gradient offset.

* * * * *